(12) United States Patent
Yu et al.

(10) Patent No.: US 8,395,246 B2
(45) Date of Patent: Mar. 12, 2013

(54) TWO-SIDED DIE IN A FOUR-SIDED LEADFRAME BASED PACKAGE

(75) Inventors: Cheemen Yu, Madison, WI (US); Vani Verma, Sunnyvale, CA (US); Hem Takiar, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 690 days.

(21) Appl. No.: 11/770,066

(22) Filed: Jun. 28, 2007

(65) Prior Publication Data
US 2009/0001534 A1    Jan. 1, 2009

(51) Int. Cl.
*H01L 23/495* (2006.01)
(52) U.S. Cl. ........ 257/676; 257/666; 257/692; 257/693; 257/694; 257/695; 257/696; 257/734; 257/773; 257/E23.031
(58) Field of Classification Search ............ 257/676, 257/666, E23.031, 692, 693, 694, 695, 696, 257/734, 773
See application file for complete search history.

(56) References Cited

U.S. PATENT DOCUMENTS

| | | | |
|---|---|---|---|
| 4,616,412 A | 10/1986 | Schroeder | |
| 5,589,420 A * | 12/1996 | Russell | 438/123 |
| 5,907,769 A * | 5/1999 | Corisis | 438/123 |
| 6,121,681 A * | 9/2000 | Tanaka et al. | 257/723 |
| 6,271,582 B1 * | 8/2001 | Schoenfeld et al. | 257/676 |
| 7,217,991 B1 | 5/2007 | Davis | |
| 2003/0170932 A1 | 9/2003 | Bolken | |
| 2004/0145042 A1 * | 7/2004 | Morita et al. | 257/692 |
| 2006/0189037 A1 | 8/2006 | Abbott | |
| 2008/0099899 A1 * | 5/2008 | Wang et al. | 257/678 |

OTHER PUBLICATIONS

Notice of Allowance and Fee(s) Due dated Feb. 22, 2010 in U.S. Appl. No. 11/707,052.
Office Action dated Jul. 23, 2009 in U.S. Appl. No. 11/770,052.
Response to Office Action filed Oct. 23, 2009 in U.S. Appl. No. 11/770,052.
U.S. Appl. No. 11/770,052, filed Jun. 28, 2007.
Office Action mailed Apr. 5, 2011 in U.S. Appl. No. 11/770,052.
Response to Office Action filed Aug. 4, 2011 in U.S. Appl. No. 11/770,052.
Notice of Allowance and Fee(s) due mailed Aug. 19, 2011 in U.S. Appl. No. 11/770,052.
Response to Office Action filed Jan. 18, 2011 in U.S. Appl. No. 11/770,052.
Notice of Allowance and Fee(s) due mailed Aug. 15, 2012 in U.S. Appl. No. 12/819,818.
Office Action mailed Oct. 18, 2010 in U.S. Appl. No. 11/770,052.

* cited by examiner

*Primary Examiner* — Junghwa M Im
(74) *Attorney, Agent, or Firm* — Vierra Magen Marcus LLP (57) ABSTRACT

A method of fabricating a leadframe-based semiconductor package, and a semiconductor package formed thereby, are disclosed. In embodiments, a semiconductor die having die bond pads along two adjacent edges may be electrically coupled to four sides of a four-sided leadframe. Embodiments relate to lead and no-lead type leadframe.

19 Claims, 6 Drawing Sheets

TWO-SIDED DIE IN A FOUR-SIDED LEADFRAME BASED PACKAGE

CROSS-REFERENCE TO RELATED APPLICATION

The following application is cross-referenced and incorporated by reference herein in its entirety:

U.S. patent application Ser. No. 11/770,052, entitled "Method Of Fabricating A Two-Sided Die In A Four-Sided Leadframe Based Package," by Cheemen Yu, et al., filed on even date herewith.

BACKGROUND OF THE INVENTION

1. Field of the Invention

Embodiments of the present invention relate to a method of fabricating a semiconductor package, and a semiconductor package formed thereby.

2. Description of the Related Art

As the size of electronic devices continue to decrease, the associated semiconductor packages that operate them are being designed with smaller form factors, lower power requirements and higher functionality. Currently, sub-micron features in semiconductor fabrication are placing higher demands on package technology including higher lead counts, reduced lead pitch, minimum footprint area and significant overall volume reduction.

One branch of semiconductor packaging involves the use of a leadframe, which is a thin layer of metal on which one or more semiconductor die are mounted. The leadframe includes electrical leads for communicating electrical signals from the one or more semiconductors to a printed circuit board or other external electrical devices. Common leadframe-based packages include plastic small outlined packages (PSOP), thin small outlined packages (TSOP), shrink small outline packages (SSOP) and thin quad flat packages (TQFP). These packages include leads which extend out from the sides of the encapsulated package, which leads may be surface mounted to a host device such as a printed circuit board (PCB) as by soldering. Another common type of leadframe-based package is a leadless package. These include dual flat no-lead (DFN) and quad flat no-lead (QFN) packages. These packages do not have leads extending out of the sides of the package, but instead have exposed terminals at a bottom surface of the package for soldering to a host device such as a PCB. The leadframe package shown in FIGS. 1 and 2 may be used in either leaded (e.g., TSOP) or leadless (e.g., DFN) packages.

Figure 1:
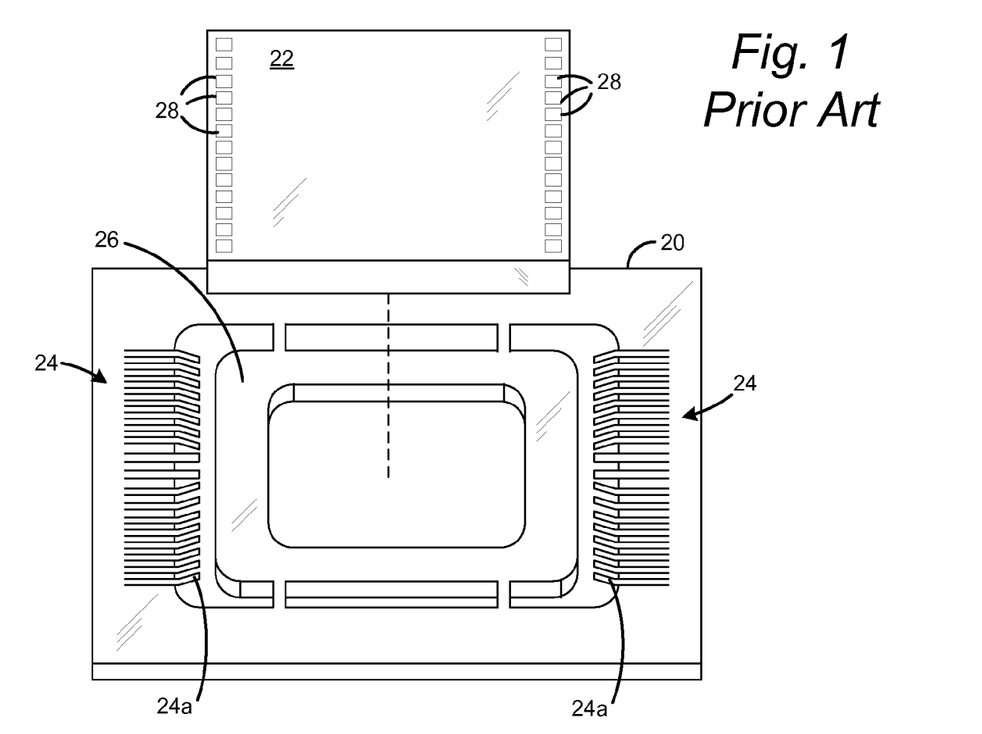
FIG. 1 is an exploded perspective view of a conventional leadframe and a semiconductor die.

FIG. 1 shows a leadframe 20 before attachment of a semiconductor die 22. A typical leadframe 20 may include a number of leads 24 having first ends 24a for attaching to semiconductor die 22, and a second end (not shown) for affixing to a printed circuit board or other electrical component. Leadframe 20 may further include a die attach pad 26 for structurally supporting semiconductor die 22 on leadframe 20. While die attach pad 26 may provide a path to ground, it conventionally does not carry signals to or from the semiconductor die 22. In certain leadframe configurations, it is known to omit die attach pad 26 and instead attach the semiconductor die directly to the leadframe leads in a so-called chip on lead (COL) configuration.

Figure 2:
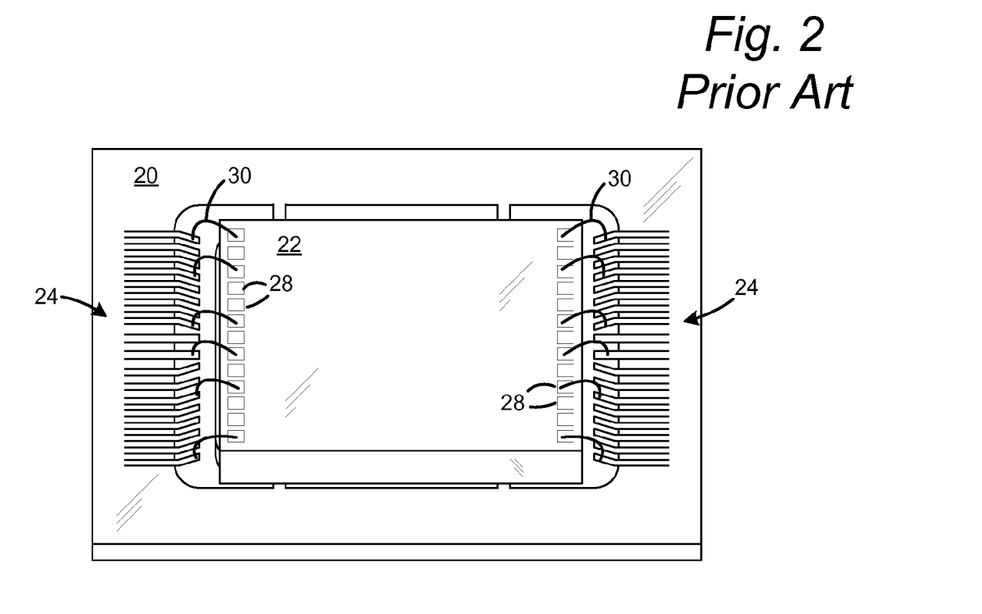
FIG. 2 is a perspective view of a semiconductor die affixed to a conventional leadframe.

Semiconductor leads 24 may be mounted to die attach pad 26 as shown in FIG. 2 using a die attach compound. Semiconductor die 22 is conventionally formed with a plurality of die bond pads 28 on at least first and second opposed edges on the top side of the semiconductor die. Once the semiconductor die is mounted to the leadframe, a wire bond process is performed whereby bond pads 28 are electrically coupled to respective electrical leads 24 using a delicate wire 30. The assignment of a bond pad 28 to a particular electrical lead 24 is defined by industry standard specification. FIG. 2 shows less than all of the bond pads 28 being wired to leads 24 for clarity, but each bond pad may be wired to its respective electrical lead in conventional designs. It is also known to have less than all of the bond pads wired to an electrical lead as shown in FIG. 2.

Figure 3:
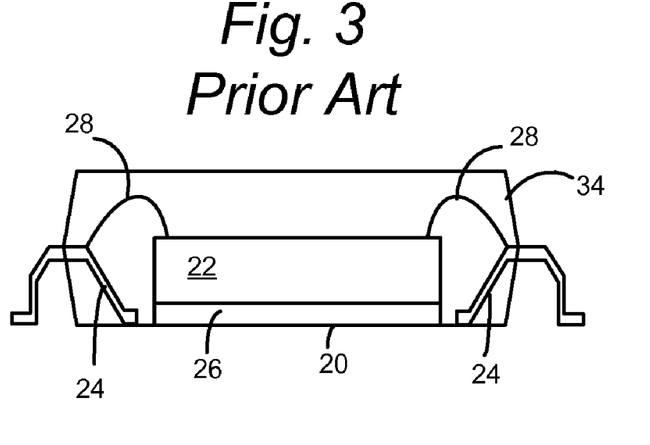
FIG. 3 is a cross-sectional view of a conventional leadframe-based semiconductor package.

FIG. 3 shows a cross-sectional side view of leadframe 20 and semiconductor die 22 after the wire bond process. Once wire bonding is completed, a molding process is performed to encase the components in a molding compound 34 to form the finished package. It is known to recess or "down-set" the semiconductor die within the leadframe, as shown in FIG. 3, in order to balance the semiconductor die against the forces of the molding compound as it flows around the die and leadframe.

As shown in FIGS. 2 and 3, it is typical to have bond pads 28 on first and second opposite sides of the semiconductor die 22 for electrical coupling with their respective leads. According to industry specification and ease of design, bond pads 28 along the first edge of the semiconductor die connect to respective leadframe leads adjacent to the first edge of the semiconductor die, and bond pads along the second, opposite edge of the semiconductor die connect to respective leadframe leads adjacent to the second edge of the semiconductor die.

Figure 4:
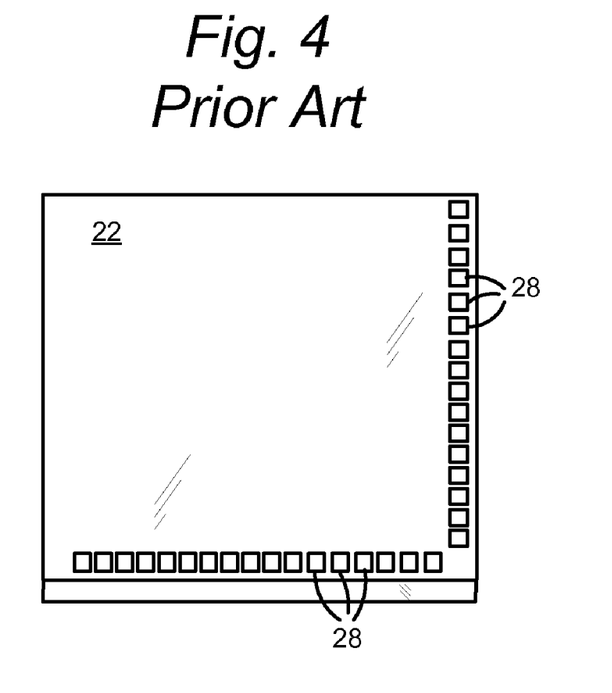
FIG. 4 is a perspective view of a conventional semiconductor die having die bond pads along two adjacent edges.

In an effort to reduce semiconductor die form factor, it is now known to provide bond pads on certain semiconductor die, such as for example ASIC controllers, along only one edge of the die, or two adjacent edges as shown in FIG. 4. A problem with such configurations is that four-sided leadframes generally do not have enough leads on a single side to accommodate all of the die bond pads along the edge of a die having pads along one or two edges (there would be more die bond pads along a side than is shown in FIG. 4).

It is currently known to provide a BGA (Ball Grid Array) package to connect to two-sided die. BGA packages provide the advantage that they have high pin-out density and are able to connect to each of the die bond pads in a flip-chip arrangement. However, BGA packages are expensive and not desirable for certain applications. It is therefore desirable to provide a four-sided leadframe capable of connecting to all of the die bond pads along one or two edges of a semiconductor die.

SUMMARY OF THE INVENTION

The present invention, roughly described, relates to a method of fabricating a leadframe-based semiconductor package, and a semiconductor package formed thereby. In embodiments, a semiconductor die having die bond pads along two adjacent edges may be electrically coupled to four sides of a four-sided leadframe. A first embodiment relates to a lead-based leadframe such as TQFP. In such an embodiment, a pair of sides of the leadframe adjacent the bond pad edges of the die include a plurality of conventional electrical leads which terminate a short distance from the first side for connection to the adjacent bond pads. The remaining pair of sides of the leadframe distal from the bond pad edges of the die each may include one or more elongated electrical leads. These elongated electrical leads extend from their respective sides into an interior of the leadframe and terminate adjacent the die bond pads.

In one embodiment, the elongated leads may be provided over a top surface of the semiconductor die, i.e., on a same side of the die as the die bond pads. In this embodiment, during fabrication, the leadframe may be flipped over, and the die may be lowered onto the leadframe with the die bond pads facing the leadframe. Once affixed, the leadframe and die may be flipped over and the bond pads may be wire bonded to the leads and elongated leads on the four sides of the leadframe. In an alternative embodiment, the elongated leads may be provided beneath the semiconductor die.

A further embodiment relates to connecting a semiconductor die with bond pads along two adjacent edges to a four-sided QFN leadframe. In this embodiment, a group of terminals on two adjacent sides are electrically coupled to a die attach paddle in a center of the leadframe. Thereafter, a semiconductor die may be bonded to the leadframe off-center. Namely, the edges of the die not having die bond pads may be positioned over the group of terminals coupled to the die attach paddle. Thereafter, terminals from all four sides of the leadframe may be wire bonded to the semiconductor die. All of the terminals from the two sides of the leadframe spaced from the die may be wire bonded to the die bond pads. Also, terminals from the remaining two sides which are not electrically coupled to the die attach paddle may be wire bonded to the die bond pads. The terminals coupled to the die attach paddle are not used for signal transfer to or from the semiconductor die.

DETAILED DESCRIPTION

Embodiments of the present invention will now be described in reference to FIGS. 5-11 which in general relate to a method of fabricating a semiconductor package, and a semiconductor package formed thereby. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 5:
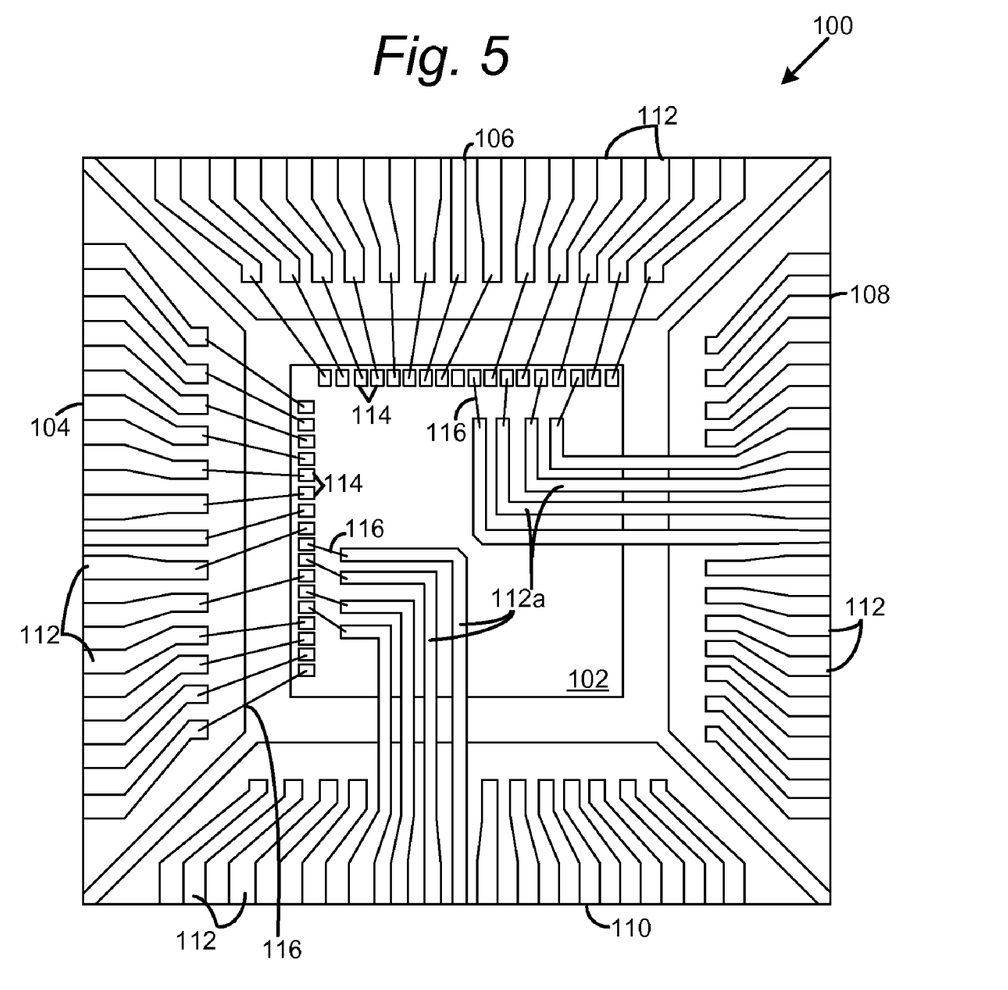
FIG. 5 is a top view of a leadframe according to an embodiment of the present invention including a semiconductor die affixed to electrical leads of the leadframe.

FIG. 5 is a top view of a leadframe 100 including a semiconductor die 102. In general, the leadframe 100 according to the present invention may be batch processed from a panel of such leadframes to achieve economies of scale. Leadframe 100 further includes electrical leads 112 for communicating electrical signals to and from the semiconductor die 102 and an external electronic device, such as a printed circuit board, on which the finished package is mounted. As explained hereinafter, leads 112 include a group of elongated leads 112a for coupling to die bond pads 114 positioned along an adjacent side of the leadframe. The leadframe 100 may be a TQFP (four-sided) leadframe, but it is understood that other types of leadframe packages may be used, such as PSOP, TSOP and SSOP leadframes.

As explained hereinafter, the die 102 may mount directly on leads 112a in an LOC (lead-on-chip) or COL (chip-on-lead) arrangement. Although not critical to the present invention, the semiconductor die 102 may for example be a flash memory chip (NOR/NAND), SRAM or DDR, or a controller chip such as an ASIC. It is understood that the leadframe 100 and die 102 may be used in a variety of different types of semiconductor packages. The die 102 may further include die bond pads 114 for coupling to the electrical leads 112 as explained hereinafter. It is understood that leadframe 100 may include greater or fewer leads 112 than are shown in the figures, and it is understood that semiconductor die 102 would likely include more die bond pads 114 that are shown, but may include less in embodiments of the invention. It is also understood that not all die bond pads 114 need be coupled to a lead 112 in embodiments of the invention.

Leadframe 100 may be formed of a planar or substantially planar piece of metal, such as copper or copper alloys, plated copper or plated copper alloys, Alloy 42 (42Fe/58Ni), or copper plated steel. Leadframe 100 may be formed of other metals and materials known for use in leadframes. In embodiments, leadframe 100 may also be plated with silver, gold, nickel palladium, or copper.

Leadframe 100 may be formed by known fabrication processes, such as for example, chemical etching. In chemical etching, a photoresist film may be applied to the leadframe. A pattern photomask containing the outline of the leads 112 and other features of leadframe 100 may then be placed over the photoresist film. The photoresist film may then be exposed and developed to remove the photoresist from areas on the conductive layers that are to be etched. The exposed areas are next etched away using an etchant such as ferric chloride or the like to define the pattern in the leadframe 100. The photoresist may then be removed. Other known chemical etching processes are known. The leadframe 100 may alternatively be formed in a mechanical stamping process using progressive dies. As is known, mechanical stamping uses sets of dies to mechanically remove metal from a metal strip in successive steps.

Leadframe 100 includes four sides 104, 106, 108 and 110. Each side includes a plurality of leads 112, each having a first end for coupling to a bond pad of die 102 via a wire bond, and a second end opposite the first end for connection to an external host device such as a printed circuit board (not shown). Leadframe 100 may be fabricated with leads 112 including a group of elongated leads 112a. Leads 112a may extend into a center of the leadframe, an area typically reserved for the semiconductor die in conventional leadframes. In general, leads 112a are provided to extend to a position adjacent the die bond pads 114 along an adjacent edge of leadframe 100. Thus, in the embodiment shown in FIG. 5, the leads 112a on side 110 extend into the middle of the leadframe 100, and then toward side 104 where they terminate adjacent to die bond pads 114. Similarly, the leads 112a on side 108 extend into the middle of the leadframe 100, and then toward side 106 where they terminate adjacent to die bond pads 114.

While FIG. 5 shows a group of four elongated leads 112a projecting from each of sides 108 and 110, it is understood that a group of one to three leads 112a, or more than four leads 112a, may project from a given side to connect with one or more die bond pads along the adjacent edge of leadframe 100. Moreover, while FIG. 5 shows a group of leads 112a extending into the center and then out to the adjacent leadframe side, those of skill in the art would appreciate a wide variety of other configurations of leads 112 and 112a that may be formed on leadframe 100 during the fabrication of leadframe 100. In embodiments, the leads 112 of leadframe 100 allow the semiconductor die 102 to be used in an industry standard pin-out configuration.

Figure 6:
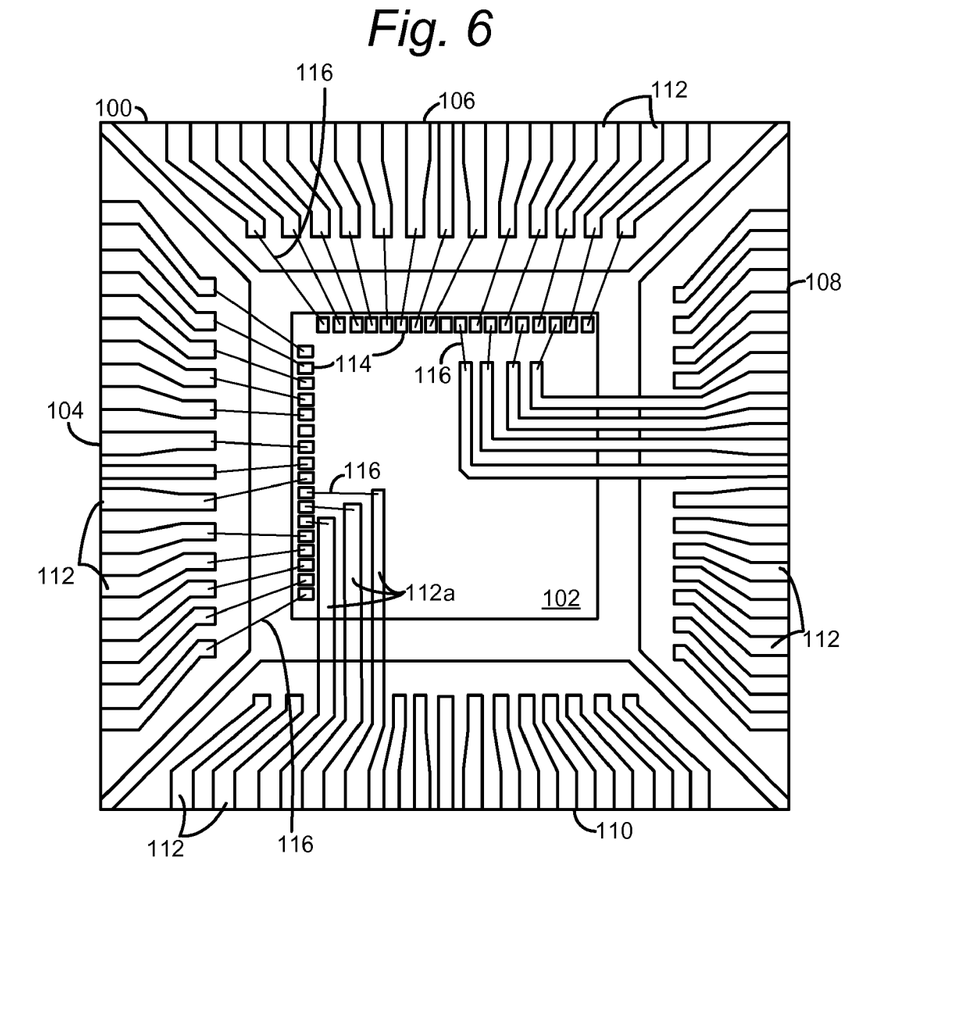
FIG. 6 is a top view of a leadframe according to an alternative embodiment of the present invention including a semiconductor die affixed to electrical leads of the leadframe.

One example of an alternative configuration is shown in FIG. 6. In FIG. 6, a group of leads 112a from side 110 which are located adjacent to side 104 extend straight into the center of leadframe 100 where they terminate without extending toward side 104. Leads 112a extending from side 110 in FIG. 6 are close enough to bond pads 114 adjacent to side 104 for wire bonding as is known and as is explained hereinafter. In embodiments such as shown in FIG. 5, the leads 112a emanating from side 108 may be the same shape as, but the mirror image of, the leads 112a emanating from side 110. As shown in FIG. 6, the adjacent sides which include elongated leads 112a need not have the same configurations of elongated leads 112a.

After formation of the leadframe 100, the die 102 may be mounted to leads 112a of leadframe 100. In embodiments, leadframe 100 may be flipped over so that the surface opposite that seen in FIGS. 5 and 6 faces upward. Similarly, die 102 may be flipped over and lowered onto leadframe 100 so as to be supported on portions of leads 112a. Die 102 may then be attached to leads 112a using a dielectric die attach compound, film or tape. It is also contemplated that a dielectric spacer layer may be provided between die 102 and leads 112a in embodiments. After the die 102 is securely affixed to the leadframe 100, the leadframe and die may again be flipped over to be in the orientation seen in the top views of FIGS. 5 and 6, and the cross-sectional view of FIG. 7.

Thereafter, wire bonds 116 may be formed in a known manner electrically coupling die bond pads 114 to leads 112 and leads 112a. In particular, with reference for example to FIG. 6, die bond pads 114 adjacent to side 106 may be coupled by wire bond to leads 112 along side 106. Additionally, leads 112a protruding from side 108 may also be affixed to die bond pads 114 adjacent side 106, from a side of die bond pads 114 opposite leads 112 from side 106.

Figure 7:
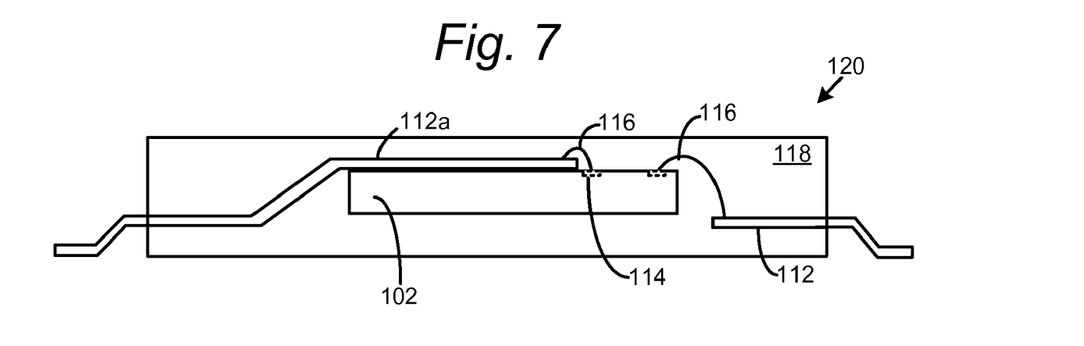
FIG. 7 is a cross-sectional side view of the leadframe and semiconductor die of FIGS. 5 or 6 encapsulated in mold compound to form a semiconductor package.

After leads 112 (including leads 112a) are wire bonded to die bond pads 114, leadframe 100 and die 102 may be encapsulated in a mold compound 118 in a known encapsulation process to form a completed portable memory package 120 as shown in FIG. 7. Mold compound 118 may be an epoxy such as for example available from Sumitomo Corp. and Nitto Denko Corp., both having headquarters in Japan. Other mold compounds from other manufacturers are contemplated. The mold compound 118 may be applied according to various processes, including by transfer mold or injection mold techniques to form package 120. The ends of leads 112 protrude from mold compound 118 and may be surface mounted to a host device such as a PCB to electrically and physically couple the package 120 to the host device.

Figure 8:
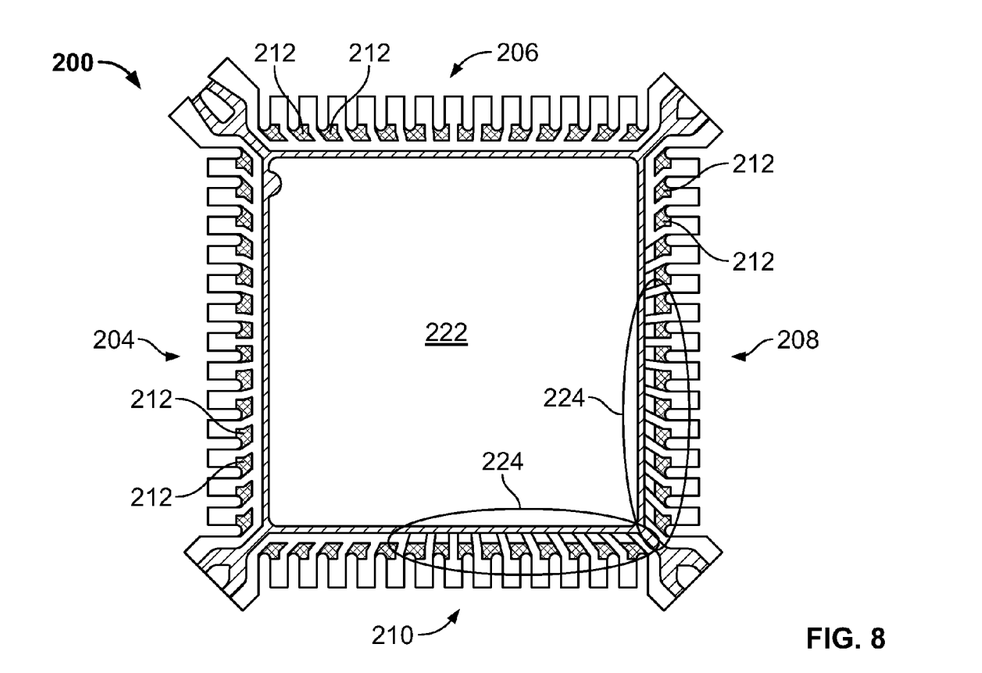
FIG. 8 is a top view of a QFN leadframe according to an alternative embodiment of the present invention.
Figure 9:
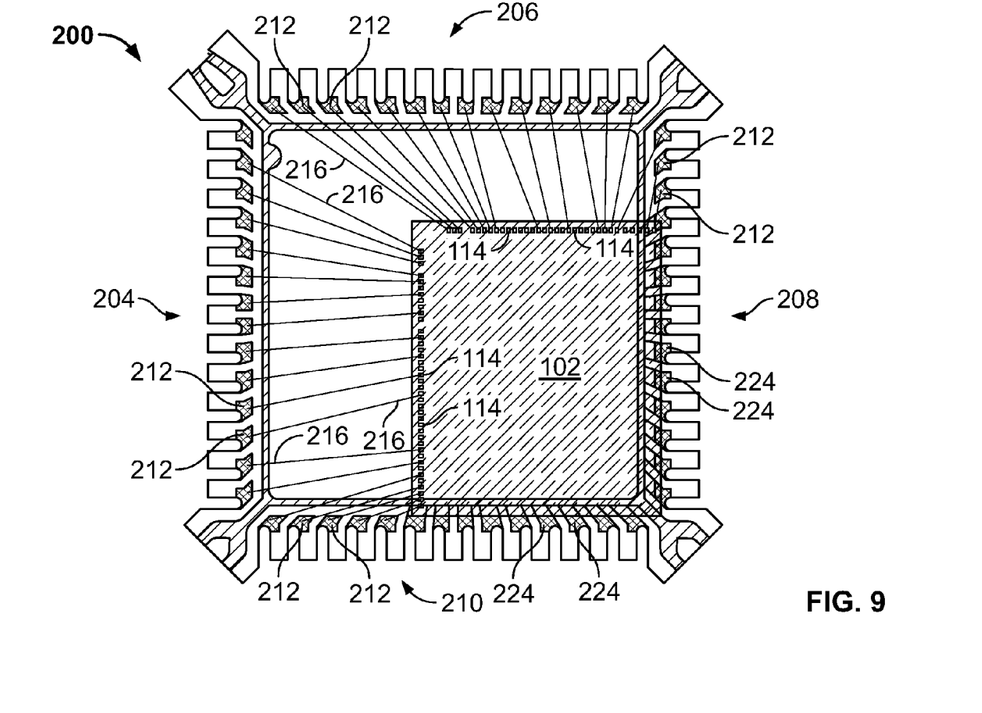
FIG. 9 is a top view of the QFN leadframe of FIG. 8 having a semiconductor die attached thereto.

FIGS. 8 and 9 are top views of a leadframe 200 according to an alternative embodiment of the present invention. Analogous components from FIGS. 5 through 7 are indicated in FIGS. 8 and 9 with their reference number incremented by 100. Leadframe 200 may be a QFN-type leadframe including a plurality of terminals 212 and 224 around four sides 204, 206, 208 and 210. Leadframe 200 further includes a die attach paddle 222 in a center of the leadframe which may be used as a heat sink and ground plane for a semiconductor die affixed to leadframe 200.

In accordance with the embodiment shown in FIGS. 8 and 9, a group of terminals 224 may be electrically coupled to the die attach paddle 222. The terminals 224 may be defined during the formation of leadframe 200 to be grounded to die attach paddle 222. Alternatively, they may be formed as terminals 212 and then grounded to die attach paddle 222 as by soldering or other electrical coupling. As explained below, these terminals do not function to transfer signals to or from a semiconductor die mounted on leadframe 200. It is known to half-etch portions of a QFN leadframe, to secure the half-etched portions within a mold compound. Details relating to a half-etched leadframe are disclosed for example in U.S. Pat. No. 6,674,156, entitled, "Multiple Row Fine Pitch Leadless Leadframe Package With Use of Half-Etch Process," which patent is incorporated by reference herein in its entirety. The grounded terminals 224 may be half-etched to ensure a secure positioning of the terminals within the mold compound discussed below.

As shown in FIG. 9, a semiconductor die, such as for example semiconductor die 102 described above, may be affixed to leadframe 200 using a known die attach compound, film or tape. According to this embodiment, die 102 may be attached off-center in a corner of leadframe 200 on die attach paddle 222 and on terminals 224 grounded to the die attach paddle 222. In particular, the two edges of die 102 not having bond pads 114 are positioned over grounded terminals 224. Thus, in the example of FIG. 9, die 102 is positioned in the lower right hand corner of leadframe 200. Such positioning of die 102 allows wire bonds to be formed between die bond pads 114 and sides 204 and 206, and portions of sides 208 and 210 as explained below.

After mounting of the semiconductor die 102 as shown in FIG. 9, terminals 212 along the sides of leadframe 200 spaced from die 102 may be wire bonded to die bond pads 114 using wire bonds 216 in a known wire bond process. Moreover, in embodiments, terminals 212 (i.e., those terminals not grounded to the die paddle 222) on the sides of leadframe 200 adjacent to die 102 may also be bonded to die bond pads 114 via wire bonds 216. For example, in FIG. 9, terminals 212 on side 208 located next to grounded terminals 224 may be affixed to bond pads 114 on semiconductor die 102 and terminals 212 on side 210 located next to grounded terminals 224 may be affixed to bond pads on semiconductor die 102. Terminals 224 are not wire bonded to die 102 and are not used for signal transfer to or from die 102. While all of the terminals beneath the die 102 are shown as grounded terminals 224, it is understood that one or more of the terminals beneath the die need not be grounded.

As die 102 is mounted in a corner of leadframe 200, access to the die bond pads 114 for wire bonding is allowed from all four sides of QFN leadframe 200. That is, as shown in FIG. 9, all of the terminals 212 along sides 204 and 206 may be wire bonded to die 102 and portions of the terminals 212 along sides 208 and 210 may be wire bonded to die bond pads 114.

The leadframe 200 and coupled die 102 may next be encapsulated in a mold compound, such as described above with respect to FIG. 7, resulting in a standard form factor QFN package. Terminals 212 of the QFN package may be surface mounted to a host device such as a PCB to electrically and physically couple the QFN package to the host device.

Figure 10:
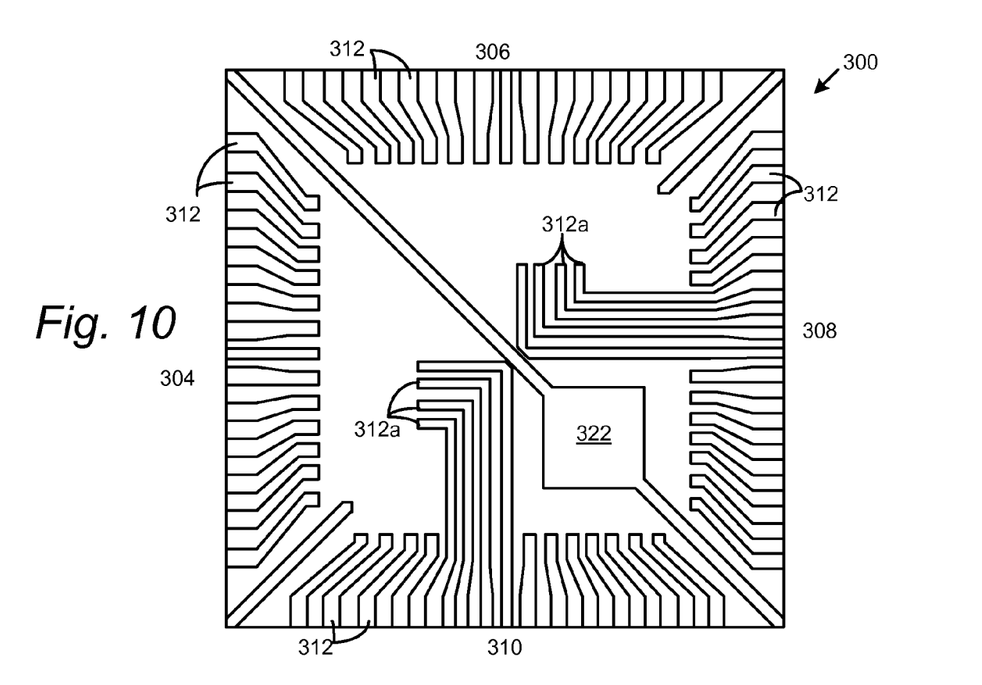
FIG. 10 is a top view of a leadframe according to a further alternative embodiment of the present invention.
Figure 11:
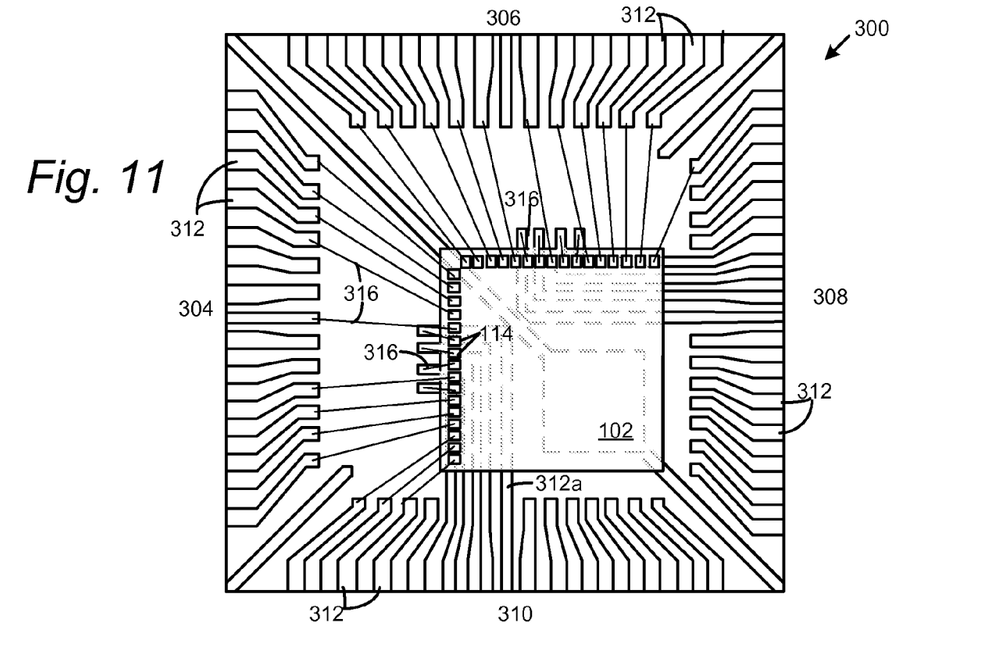
FIG. 11 is a top view of the leadframe of FIG. 10 including a semiconductor die attached thereto.

A further embodiment of the present invention is shown in FIGS. 10 and 11. This embodiment may be similar to the embodiment of FIGS. 5 through 7, but in the embodiment of FIGS. 10 and 11, the elongated leads are provided underneath the semiconductor die. Analogous components from FIGS. 5 through 7 are indicated in FIGS. 10 and 11 with their reference number incremented by 200. Leadframe 300 may be a lead-type leadframe including a plurality of leads 312 around four sides 304, 306, 308 and 310. Leadframe 300 may further include a die attach paddle 322 for supporting a semiconductor die, such as semiconductor die 102 described above. Paddle 322 may be omitted in alternative embodiments.

As shown in FIG. 11, a semiconductor die 102 having bond pads 114 may be attached to paddle 322 and/or leads 312*a* using a dielectric die attach compound, film or tape. Leads 312*a* may extend into a center of leadframe 300 and out to a position adjacent the die bond pads 114 along an adjacent edge of leadframe 300. Thus, in the embodiment shown in FIG. 10, the leads 312*a* on side 310 extend into the middle of the leadframe 300, and then toward side 304 where they terminate adjacent to die bond pads 114. Similarly, the leads 312*a* on side 308 extend into the middle of the leadframe 300, and then toward side 306 where they terminate adjacent to die bond pads 114.

While FIG. 10 shows a group of four elongated leads 312*a* projecting from each of sides 308 and 310, it is understood that a group of one to three leads 312*a*, or more than four leads 312*a*, may project from a given side to connect with one or more die bond pads 114 along the adjacent edge of leadframe 300. Moreover, while FIG. 10 shows a group of leads 312*a* extending into the center and then out to the adjacent leadframe side, those of skill in the art would appreciate a wide variety of other configurations of leads 312 and 312*a* that may be formed on leadframe 300 during the fabrication of leadframe 300.

Once the die is affixed to the leadframe 300, wire bonds 316 may be formed in a known manner electrically coupling die bond pads 114 to leads 312 and leads 312*a*. After leads 312, 312*a* are wire bonded to die bond pads 114, leadframe 300 and die 102 may be encapsulated in a mold compound in a known encapsulation process to form a completed portable memory package. The ends of leads 312 may protrude from the package and may be surface mounted to a host device such as a PCB to electrically and physically couple the package to the host device.

In embodiments, a spacer layer (not shown) may be affixed to generally horizontal surfaces of electrical leads 312*a* on a side of electrical leads 312*a* opposite semiconductor die 102. In embodiments, the spacer layer may be a dielectric material such as for example a polyimide film or tape, or epoxy resins (FR-4, FR-5) or bismaleimide triazine (BT), affixed to electrical leads 312 by a known adhesive compound. The thickness of the spacer layer may vary in alternative embodiments. It may happen during encapsulation that leads 312*a* are forced downward and possibly exposed to the exterior on a surface of the mold compound. The spacer layer may be used to ensure that the leads remain buried within the package. The spacer layer may also provide structural stability to leads 312*a*. A similar spacer layer may be used in the embodiment shown in FIGS. 5 through 7 in embodiments.

Embodiments of the present invention described thus far have included a single semiconductor die 102. It is understood that more than one semiconductor die may be included in at least some of the packages described above. Moreover, while embodiments of the invention described above are directed to connecting four sides of a leadframe to a semiconductor die having bond pads along two adjacent edges, it is contemplated that embodiments of the present invention may connect two, three or four sides of a leadframe to a semiconductor die having bond pads along a single edge.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A leadframe for receiving a semiconductor die having die bond pads along only two adjacent edges, the leadframe having a first side for receiving adjacent thereto a first edge of the semiconductor die, the first edge of the semiconductor die including die bond pads, the leadframe including a second side, adjacent the first side, for receiving adjacent thereto a second edge of the semiconductor die, the second edge of the semiconductor die including die bond pads, and the leadframe including third and fourth sides adjacent the first and second sides, the leadframe comprising:
   a first set of electrical leads on the first and second sides of the leadframe, the first set of electrical leads including first ends positioned to terminate proximate to bond pads along the first and second edges of the semiconductor die; and
   a second set of electrical leads on the third and fourth sides of the leadframe, the second set of electrical leads being longer than the first set of electrical leads and the second set of electrical leads including first ends positioned to terminate proximate to bond pads on the first and second edges of the semiconductor die.

2. The leadframe of claim 1, wherein a first group of electrical leads in the second set of electrical leads protrude from the fourth side of the leadframe into a center portion of the leadframe and then out toward the first side of the leadframe.

3. The leadframe of claim 2, wherein a second group of electrical leads in the second set of electrical leads emanate from the third side of the leadframe into a center portion of the leadframe and then out toward the second side of the leadframe.

4. The leadframe of claim 3, wherein the first and second groups of electrical leads are mirror images of each other.

5. The leadframe of claim 1, wherein a first group of leads in the second set of electrical leads emanating from the fourth side and adjacent to the first side extend into a center portion of the leadframe from where the first group of electrical leads are wire bonded to the die bond pads adjacent the first side of the leadframe.

6. The leadframe of claim 1, wherein the leadframe is for a TSOP, PSOP or SSOP.

7. A portable memory, comprising:
a semiconductor die having first and second rows of die bond pads along two adjacent edges, the remaining two adjacent edges of the semiconductor die having no die bond pads;
a leadframe including first, second, third and fourth sides, the semiconductor die being mounted on the leadframe with the first row of die bond pads adjacent the first side of the leadframe and with the second row of die bond pads adjacent the second side of the leadframe, the leadframe including:
   a first set of electrical leads on the first and second sides of the leadframe, the first set of electrical leads including first ends terminating proximate to the first and second rows of bond pads on the semiconductor die, and
   a second set of electrical leads on the third and fourth sides of the leadframe, the second set of electrical leads being longer than the first set of electrical leads and the second set of electrical leads including first ends terminating proximate to the first and second rows of bond pads on the semiconductor die; and
wire bonds for bonding the first ends of the first and second sets of electrical leads to the first and second rows of die bond pads.

8. The portable memory of claim 7, the second set of electrical leads extending over a surface of the semiconductor die including the die bond pads.

9. The portable memory of claim 7, the second set of electrical leads extending beneath a surface of the semiconductor die opposite the surface of the semiconductor die including the die bond pads.

10. The portable memory of claim 7, wherein the second set of electrical leads extend into a center portion of the leadframe and then out toward at least one of the first and second sides of the leadframe.

11. The portable memory of claim 7, further comprising mold compound for encapsulating the leadframe and semiconductor die.

12. The portable memory of claim 11, wherein the first and second sets of electrical leads include second ends protruding from the mold compound and shaped for mounting to a printed circuit board in a surface mount process.

13. The portable memory of claim 7, wherein the portable memory is one of a TSOP, a PSOP and an SSOP.

14. A portable memory, comprising:
a semiconductor die having first and second rows of die bond pads along only two adjacent edges;
a leadframe including first, second, third and fourth sides, the semiconductor die being mounted on the leadframe with the first row of die bond pads adjacent the first side of the leadframe and with the second row of die bond pads adjacent the second side of the leadframe, the leadframe including:
   a first set of electrical leads on the first and second sides of the leadframe, the first set of electrical leads including first ends terminating proximate to the first and second rows of bond pads on the semiconductor die, and
   a second set of electrical leads on the third and fourth sides of the leadframe, the second set of electrical leads being longer than the first set of electrical leads and the second set of electrical leads including first ends terminating proximate to the first and second rows of bond pads on the semiconductor die, the second set of electrical leads being bonded to a surface of the semiconductor die including the first and second rows of die bond pads;
wire bonds for bonding the first ends of the first and second sets of electrical leads to the first and second rows of die bond pads: and
mold compound for encapsulating the leadframe and semiconductor die.

15. The portable memory of claim 14, wherein the second set of electrical leads extend into a center portion of the leadframe and then out toward at least one of the first and second sides of the leadframe.

16. The portable memory of claim 14, wherein the portable memory is one of a TSOP, a PSOP and an SSOP.

17. A portable memory, comprising:
a leadframe including first, second, third and fourth sides and a plurality of terminals in the first, second, third and fourth sides;
a die attach paddle in a center of the leadframe;
a semiconductor die having first and second rows of die bond pads along two adjacent edges, a pair of adjacent edges of the semiconductor die having no die bond pads positioned in a corner of the leadframe formed by the third and fourth sides of the leadframe, the semiconductor die covering a set of terminals in the third and fourth sides, the covered terminals in the third and fourth sides being electrically coupled to the die attach paddle; and
wire bonds between the die bond pads and the terminals on the first and second sides of the leadframe, and between the die bond pads and terminals on portions of the third and fourth sides of the leadframe not covered by the semiconductor die.

18. The portable memory of claim 17, wherein the leadframe is half-etched at the set of terminals coupled to the die attach paddle.

19. The portable memory of claim 17, wherein the portable memory is a QFN-type package.

* * * * *